(12) United States Patent
Yoshimasu et al.

(10) Patent No.: US 8,773,224 B2
(45) Date of Patent: Jul. 8, 2014

(54) FREQUENCY MULTIPLIER

(75) Inventors: Toshihiko Yoshimasu, Kitakyushu (JP); Takayuki Shibata, Nisshin (JP)

(73) Assignees: DENSO CORPORATION, Kariya (JP); Waseda University, Tokyo (JP)

( * ) Notice: Subject to any disclaimer, the term of this patent is extended or adjusted under 35 U.S.C. 154(b) by 415 days.

(21) Appl. No.: 13/305,829

(22) Filed: Nov. 29, 2011

(65) Prior Publication Data

US 2012/0133400 A1     May 31, 2012

(30) Foreign Application Priority Data

Nov. 30, 2010   (JP) ................................ 2010-266180

(51) Int. Cl.
    *H03B 19/00*      (2006.01)
    *H01P 1/20*      (2006.01)

(52) U.S. Cl.
    USPC .......................................... 333/218; 327/119

(58) Field of Classification Search
    USPC ............................ 333/218; 327/119, 122, 123
    See application file for complete search history.

(56) References Cited

U.S. PATENT DOCUMENTS 4,931,921 A * 6/1990 Anderson ..................... 363/163
6,066,997 A * 5/2000 Matsugatani et al. ........ 333/218
6,388,546 B1 * 5/2002 Kikokawa et al. ............ 333/218

FOREIGN PATENT DOCUMENTS

JP            2998837          1/2000

* cited by examiner

*Primary Examiner* — Dean O Takaoka
(74) *Attorney, Agent, or Firm* — Posz Law Group, PLC

(57) ABSTRACT

A frequency multiplier includes an input circuit, an output circuit, and a resonance circuit. The input circuit is coupled to an input node and a middle node. The middle node provides a middle signal that has a signal component having the same frequency as an input signal that is provided to the input node. The middle signal further has an even number "n" multiple of the input signal frequency. The output circuit has a predetermined input impedance for the middle node. The resonance circuit includes an inductor that is coupled in series with a capacitor, where the capacitor is in a parallel connection to the middle node. The resonance circuit has a resonance frequency that is equal to a frequency of the input signal, and such resonance circuit also has an output impedance that matches with the predetermined input impedance of the output circuit.

6 Claims, 8 Drawing Sheets

FREQUENCY MULTIPLIER

CROSS REFERENCE TO RELATED APPLICATION

The present application is based on and claims the benefit of priority of Japanese Patent Application No. 2010-266180, filed on Nov. 30, 2010, the disclosure of which is incorporated herein by reference.

TECHNICAL FIELD

The present disclosure generally relates to a frequency multiplier used mainly for a communication device.

BACKGROUND

Conventionally, a frequency multiplier utilizes the non-linearity of transistors, such as a field effect transistor (FET), a bipolar transistor, and the like. By grounding the transistors common terminals and by operating it at or around the pinch-off region of its functionality, the frequency multiplier is configured to generate a high frequency wave.

FIG. 7 shows a circuit diagram of a conventional frequency multiplier that uses FETs. The circuit in FIG. 7, as described in Japanese Patent 2,998,837 (JP '837), is a combination of a microwave frequency multiplier and an amplifier. In FIG. 7, the frequency multiplier includes an input node 11, an output node 12, an FET 110 with its source coupled to the ground, an input impedance matching circuit 130, an output matching circuit 160, a stub circuit 150 for the short-circuiting of a fundamental wave from an output terminal of the FET 110. When the FET 110 is operated at or around the pinch-off region, the waveform of the output electric current has a half-wave rectified form, and includes, in its output spectrum, many high frequency wave components that are generated to have an even-ordered multiplication of the input frequency. Among the output waves in such output spectrum, a wave having the greatest output power is a double wave. Therefore, when the fundamental wave is inputted to the circuit in FIG. 7, the output signal has a two-fold frequency of the fundamental wave.

The source of the FET 110 is grounded, and, between the gate of the FET 110 and a input node 11, transmission lines L1, L2, L3 are disposed to the input impedance matching circuit 130. Further, the drain terminal 19 of the FET 110 is coupled to the stub circuit 150, and the other end of the stub circuit is held in an open condition, which serves as a suppression circuit of the fundamental wave. The drain terminal 19 of the FET 110 is also coupled to an impedance matching circuit 170 that includes transmission lines L5, L6 and L7.

An FET 120 is a transistor serving as an amplifier, and yields a gain from the double wave. The output matching circuit 160 includes transmission lines L8, L9, L10, and serves as a part of an amplifier, and matches the output impedance of the FET 120 with its load (i.e., generally 50Ω). Further, a DC cut capacitor 17 between the FET 110 and the FET 120 is coupled for the purpose of removing or blocking the direct current component. The stub circuit 150 is an open stub (i.e., having an open end), having a dimension of one fourth of the wavelength of the fundamental wave. The stub circuit 150 serves as an open stub for the double wave, since the wavelength of the double wave is equal to one half of the wavelength of the fundamental wave. Therefore, the stub circuit 150 does not affect the impedance when the double wave is taken out from the output terminal.

However, the stub circuit 150 having the one-fourth wavelength of the fundamental wave is large, thereby making it difficult for the frequency multiplier to be a small size. For example, if a frequency multiplier is constructed on a Si substrate for the fundamental wave having the frequency of 1 GHz, the dimension of the frequency multiplier is as large as 20 mm.

A circuit configuration having a smaller circuit is also disclosed in JP '837, and is shown in FIG. 8. In this example, an inductor 804 and a capacitor 805 are connected to the drain terminal 19 of the FET 110, for the resonance of the fundamental wave. The resonance frequency $f_r$ of the resonator 820 having the inductor 804 and the capacitor 805 is represented by Equation 1 below.

$$f_r = \frac{1}{2\pi\sqrt{LC}} \qquad \text{Equation 1}$$

In such circuit, the inductor 804 has a size of about 300 to 400 μm, and, the capacitor 805 can be smaller than the inductor 804. However, it is necessary for such circuit to have an impedance matching circuit 840 that is constituted as a combination of an inductor 806 and a capacitor 807 in a latter stage next to the resonator 820, thereby making such circuit still difficult to have a reduced circuit size.

As described above in the example circuits of FIGS. 7 and 8, the fundamental wave short-circuiting circuit is connected to an output side (i.e., the drain terminal 19) of the FET 110, which is formed either as (i) the stub circuit 150 having a one-fourth wavelength of the fundamental wave or (ii) the resonator 820 constituted as a combination of the inductor 804 and the capacitor 805, and, in a latter stage of such circuit, an impedance matching circuit (30, 840) is connected. In such configuration, suppression of the fundamental wave and matching of impedance are respectively borne by different circuits, thereby making it difficult to achieve a reduced circuit size.

SUMMARY

In view of the above and other problems, the present disclosure provides a frequency multiplier that enables a reduction of the circuit size.

In an aspect of the present disclosure, the frequency multiplier has an input circuit that is disposed between an input node and a middle node for generating and outputting a middle signal that is a harmonic signal of an input signal. Specifically, the middle signal has signal components of an even n-time multiple of frequencies of the input signal that is provided to the input node, and a signal component of the same signal frequency as the input signal. The frequency multiplier further has an output circuit that has a predetermined input impedance for the middle signal to which the output circuit is coupled. The frequency multiplier includes a resonance circuit that is formed as a series connection of an inductor and a capacitor and that is coupled in parallel to the middle node. The resonance circuit has a resonance frequency that is equal to a frequency of the input signal, and such resonance circuit also has an output impedance that matches with the predetermined input impedance of the output circuit.

According to such configuration, the input circuit generates and outputs, to the middle node, the middle signal having a frequency component that is equal to the input signal frequency and other frequency components generated as n-time multiplies of the input signal frequency. For the signal component of the middle signal, which is equal to the input signal frequency $f_{in}$, the impedance of the resonance circuit is "0", thereby allowing disappearance of such signal component in the resonance circuit by the short-circuit. On the other hand, for the signal components of the middle signal having n-time multiplies of the input signal frequency $f_{in}$ (i.e., for the harmonic waves of the input signal frequency), no such disappearance occurs thereby allowing the transmission of such signal components to the output circuit. Further, since the output impedance of the resonance circuit from an output circuit side is matched with the input impedance of the output circuit, reflection of the harmonic components is suppressed.

BRIEF DESCRIPTION OF THE DRAWINGS

Objects, features, and advantages of the present disclosure will become more apparent from the following detailed description made with reference to the accompanying drawings, in which.

DETAILED DESCRIPTION

The present disclosure is now explained with reference to the drawings.

(First Embodiment)

Figure 1:
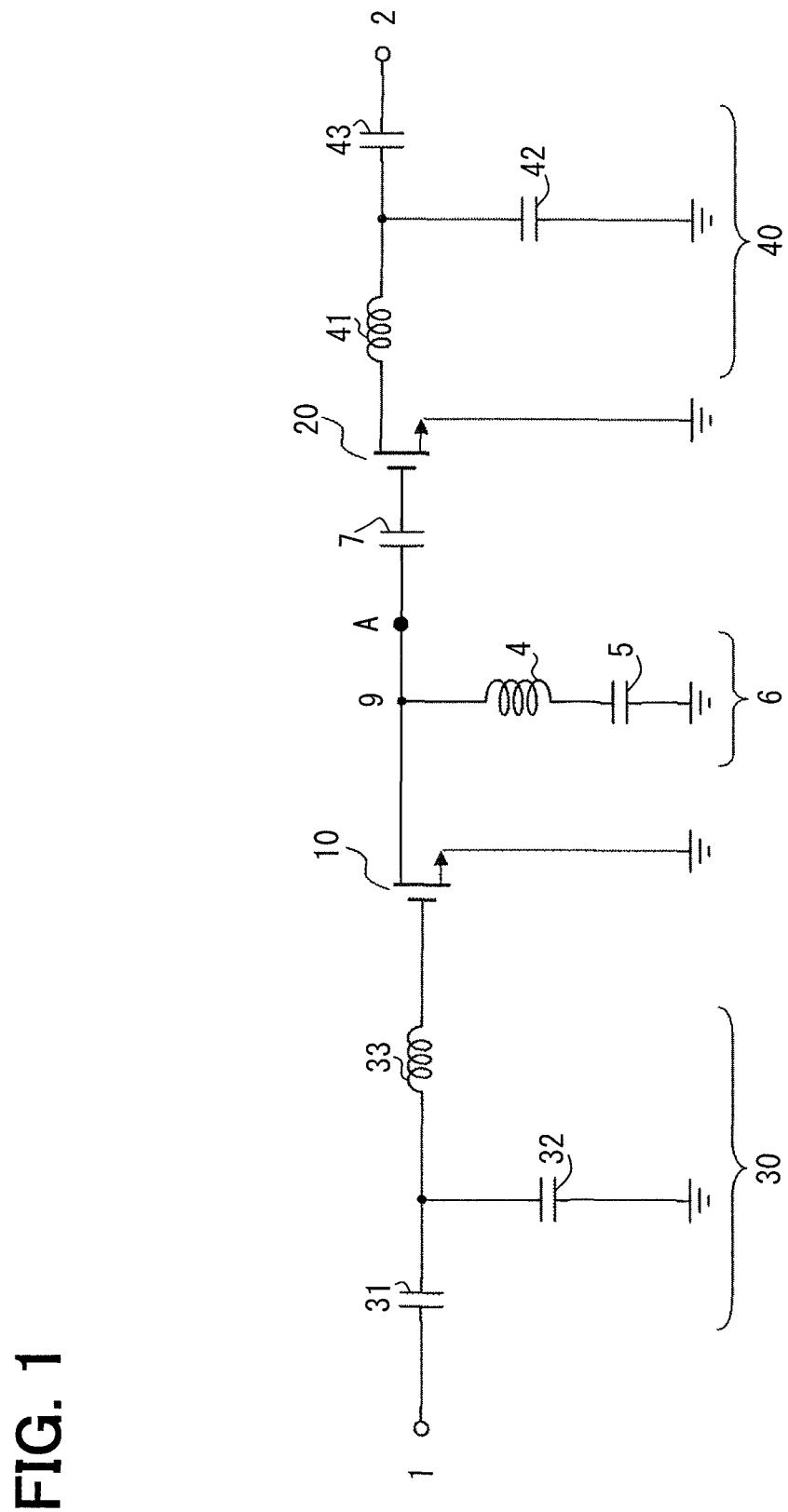
FIG. 1 is a circuit diagram of a frequency multiplier in a first embodiment of the present disclosure.

FIG. 1 is a circuit diagram of a frequency multiplier in a first embodiment of the present disclosure. The frequency multiplier in the first embodiment includes an input node 1, an output node 2, an input impedance matching circuit 30, an FET 10, a resonance circuit 6, a DC cut capacitor 7, an FET 20, and an output impedance matching circuit 40.

The input impedance matching circuit 30 is disposed between and couples to the input node 1 and a gate of the FET 10. The input impedance matching circuit 30 includes capacitors 31, 32 and an inductor 33. The capacitor 31 and the inductor 33 are coupled in series between the input node 1 and the gate of the FET 10, and the capacitor 32 is coupled to a connection node between the capacitor 31 and the inductor 33 at one end and a ground at the other end. The FET 10 is a transistor for half-wave rectification, and the source of the FET 10 coupled to the ground.

The resonance circuit 6 and the DC cut capacitor 7 are disposed between a drain of the FET 10, which is provided as a drain node 9, and a gate of the FET 20. The resonance circuit 6 includes an inductor 4 and a capacitor 5 that are coupled in series between the drain of the FET 10 and the ground.

The DC cut capacitor 7 is coupled to the drain of the FET 10 and the gate of the FET 20, and blocks any DC current. The FET 20 is configured as a an amplifier, where the source of the FET 20 is coupled to the ground. The output impedance matching circuit 40 is a circuit for the impedance matching on an output side, and is disposed between the drain of the FET 10 and the output node 2. The output impedance matching circuit 40 includes an inductor 41 and capacitors 42, 43. The inductor 41 and the capacitor 43 are coupled in series between the drain of the FET 20 and the output node 2, and the capacitor 42 is coupled to a connection node between the inductor 41 and the capacitor 43 on one end and the ground on the other end.

Accordingly, in the present embodiment, the resonance circuit 6 for fundamental wave suppression and the DC cut capacitor 7 are provided between the drain node 9 and the FET 20. Additionally, the input impedance matching circuit 30 is configured such that the supply of the electric power of the fundamental wave from the input node 1 is maintained and is not reduced, when the fundamental wave is provided to the FET 10.

The resonance circuit 6, which is coupled to the drain node 9 of the FET 10 for fundamental wave suppression, includes the inductor 4 and the capacitor 5. A resonance frequency $f_r$ of the resonance circuit 6 is represented by Equation 1, which is reproduced below. Even though the suppression of the fundamental wave is achieved when the frequency of the fundamental wave is equal to the resonance frequency $f_r$, based on Equation 1, such condition may be realized by numerous combinations of an induction coefficient L of the inductor 4 and a capacitance C of the capacitor 5.

$$f_r = \frac{1}{2\pi\sqrt{LC}} \qquad \text{Equation 1}$$

On the other hand, an impedance Z of a series circuit including the inductor 4 and the capacitor 5 is represented by the following Equation 2.

$$Z = j\omega L - \frac{1}{j\omega C} \qquad \text{Equation 2}$$

In Equation 2, ω is an angular frequency, which is defined in the following Equation 3.

$$\omega = 2\pi f \qquad \text{Equation 3:}$$

According to Equations 2 and 3, when the frequency f is greater than the resonance frequency $f_r$ ($f > f_r$), the impedance Z has inductive nature. On the other hand, the output impedance of the FET 10 has capacitive nature, and so is the input impedance of the FET 20. This is mainly because the drain-source capacitance on an output side of the FET 10 and the gate-source capacitance on an input side of the FET 20. Therefore, by using the resonance circuit 6, a complex conjugate matching between the FET 10 and the FET 20 is achieved. In other words, if it is configured that a real number component of the impedance on the left side of a middle node A is equal to a real number component of the impedance on the right side of the middle node A in FIG. 1, with their absolute values of imaginary number impedance components being equal to each other (i.e., respective imaginary number components of two impedances having the same magnitude and different plus/minus signs), the impedance matching circuit is not required, and the product size of the frequency multiplier is reduced. Although the transistors in FIG. 1 are depicted as FETs, those skilled in the art will appreciate in view of this disclosure that the FETs may be replaced with a bipolar transistor for performing the same operation as the FET.

(Second Embodiment)

Figure 2:
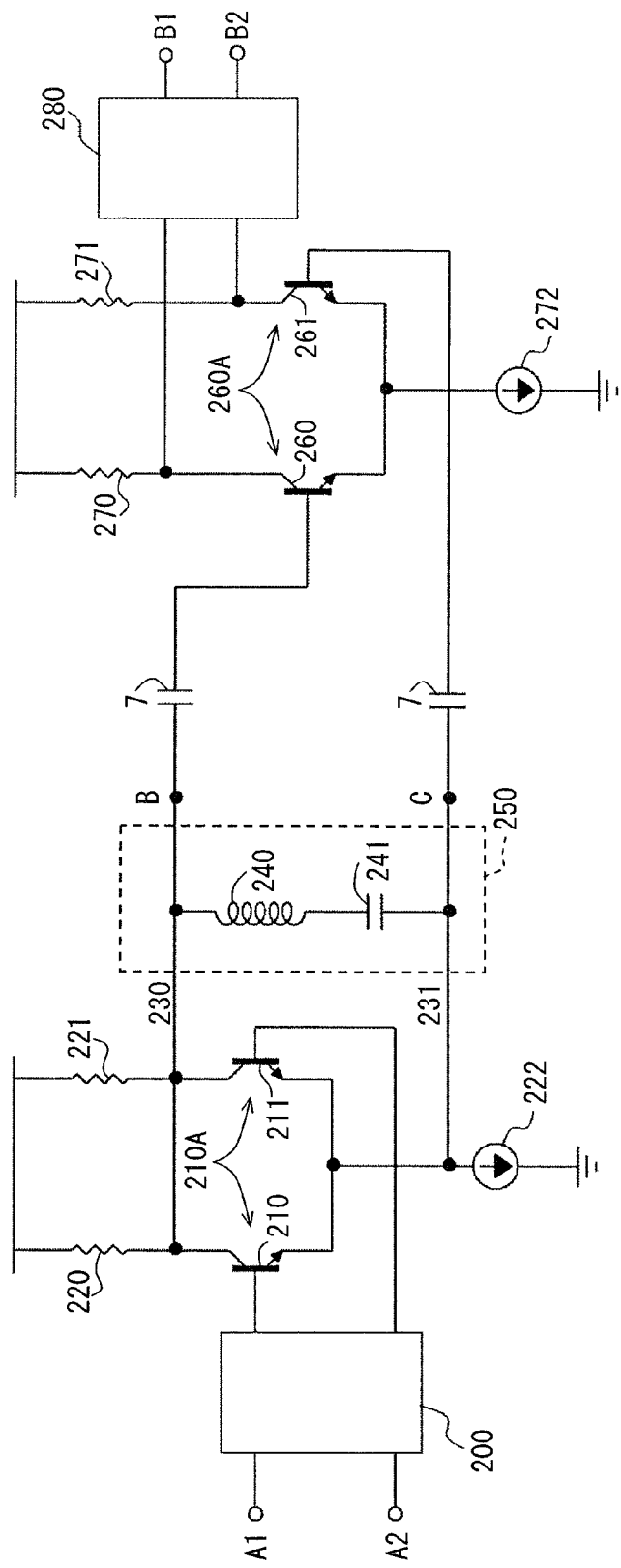
FIG. 2 is a circuit diagram of the frequency multiplier in a second embodiment of the present disclosure.

FIG. 2 is a circuit configuration diagram of the frequency multiplier in the second embodiment of the present disclosure. Due to the frequent use of the differential signal in the high frequency LSI having an Si substrate, the present embodiment shows an implementation of the present disclosure to a device using a differential signal. That is, the frequency multiplier of the present embodiment uses bipolar transistors as a component of the frequency multiplier and the output amplifier, in which a differential signal is provided as an input and an output.

In FIG. 2, the frequency multiplier in the second embodiment includes (i) an input impedance matching circuit 200; (ii) a harmonic wave generation circuit having transistors 210, 211, resistors 220, 221, and an electric power source 222; (iii) a resonance circuit 250 having an inductor 240 and a capacitor 241; and (iv) an output amplifier circuit having two DC cut capacitors 7, 7, bipolar transistors 260, 261, resistors 270, 271, and an electric power source 272; and (v) an output impedance matching circuit 280.

In the present embodiment, a node A1 and a node A2 serve as the input node to provide the differential signals that have the same amplitude and have a phase difference of 180 degree. Further, a node B1 and a node B2 serve as the output node, where each of the nodes B1, B2 output the differential signals.

In the impedance matching circuit 200, the matching circuit 30 of FIG. 1 is coupled to each of the input nodes A1, A2, to form a pair of matching circuits 30 (not illustrated).

The transistors 210, 211, which are designated as "a transistor pair 210A" or, are a transistor pair that perform the differential operation. Through each of the resistors 220, 221, DC voltage is supplied to the transistor pair 210A, thereby allowing the resistors 220, 221 to serve as a load resistor for the transistor pair 210A. The electric power source 222 provides a DC current for the transistor pair 210A. The emitter terminals and the collector terminals of the transistor pair 210A are short-circuited, and those terminals are commonly connected to nodes 230, 231, respectively.

The DC cut capacitors 7, 7 are provided to block any DC current.

The transistors 260, 261, which are designated as "a transistor pair 260A", is a differential amplifier of the double wave. The resistors 270, 271 supply the DC voltage to the transistor pair 260A, and serve as a load resistor of the transistor pair 260A. The electric power source 272 provides a DC current of the transistor pair 260A.

The inductor 240 and the capacitor 241 serves as the resonance circuit 250, which "shorts" (i.e., short-circuit) the fundamental wave, and also serves as an impedance matching device for the transistor pairs 210A, 260A.

The output impedance matching circuit 280 performs impedance matching for the output of the differential amplifier when the amplifier is seen from the output nodes B1, B2. The output impedance matching circuit 280 is, in general, coupled as a load resistor of 100Ω (not shown) between the output nodes B1, B2.

The above-described frequency multiplier in the present embodiment is explained in more detail in the following.

The differential signal or a fundamental wave that has a base frequency from the input nodes A1, A2 is provided to the transistor pair 210A via the impedance matching circuit 200. The transistor pair 210A are biased at or around the pinch-off region, and the output signal from the transistor pair 210A has a half-wave rectified waveform.

Since the collector terminals of the transistors 210, 211 are short-circuited, the fundamental wave of the output signal should be non-existent, at the node 230. That is, because of the mutual cancellation of the fundamental wave outputs from the collector terminals of the transistors 210, 211 due to the 180 degree phase difference of the inputted differential signal of the fundamental wave. On the other hand, the double wave signals that have the same phase appear on the collector terminals of the transistors 210, 211. The situation is same for the emitter terminals. Therefore, even when the collector terminals and emitter terminals of the transistor pair 210A are short-circuited, the double wave signal will not be affected.

Since the voltage of the double wave signal, which are generated between the collector terminal and the emitter terminal of the transistor pair 210A, have 180 degree phase difference, such wave can be acquired as the differential signal from the collector terminal and the emitter terminal of the transistor pair 210A. Accordingly, it should be understood to one skilled in the art, that due to production anomaly or the like of the transistors 210, 211, a nominal output of the fundamental wave may occur from the terminal of the transistors 210, 211. The resonance circuit 250 suppressing the fundamental wave is effectively used. In such situation, for the acquisition of the frequency of the double wave, the inductor 240 and the capacitor 241 in the resonance circuit 250 are designed to enable the complex conjugate matching between the transistor pair 210A and the transistor pair 260A.

Figure 3:
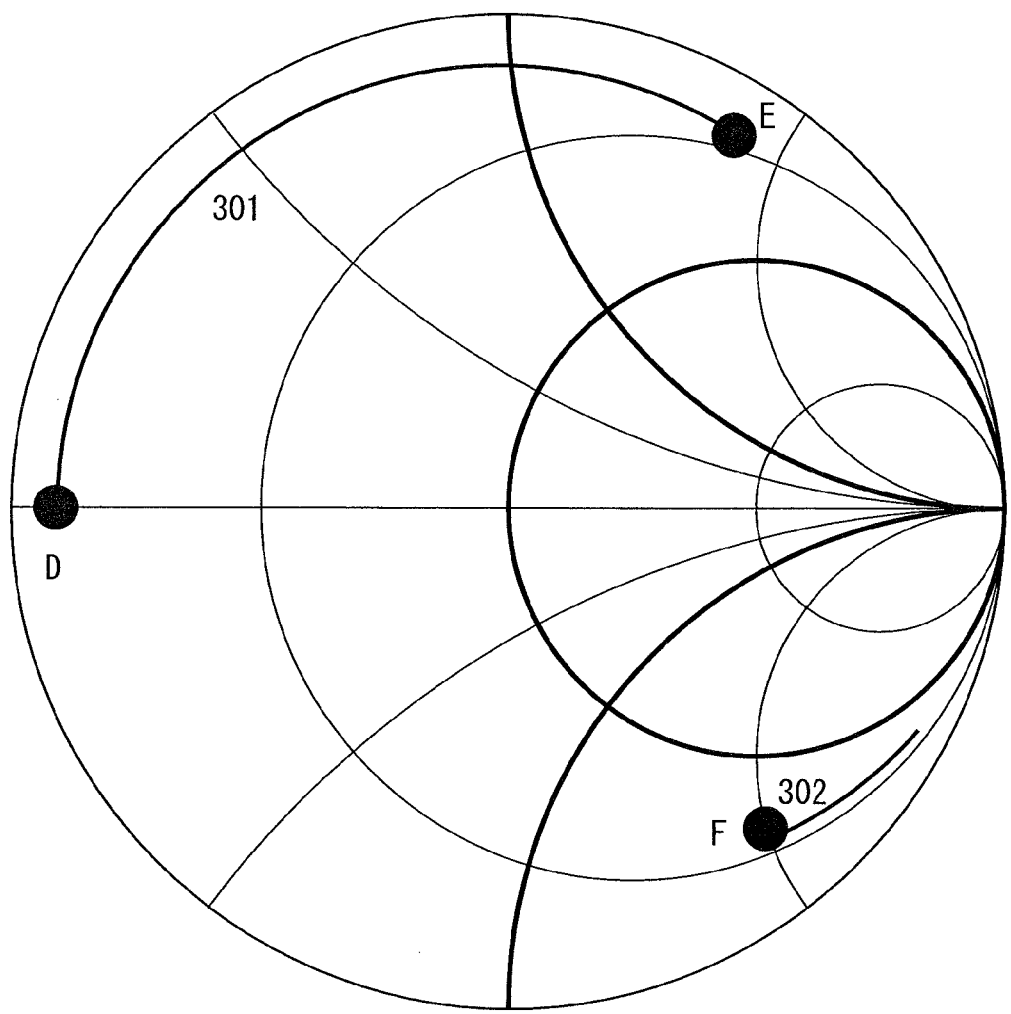
FIG. 3 is a frequency trace chart of impedance of a resonance circuit based on most suitable design values.

In FIG. 3 illustrates an example of frequency characteristics of a device using SiGe hetero-junction bipolar transistors (HBT) as the transistors 210, 211, 260, 261, a spiral inductor of 0.5 nH as the inductor 240, and a metal-insulator-metal capacitor (i.e., MIM capacitor) of 0.3 pF as the capacitor 241. The base frequency of the input fundamental wave is set to 13 GHz, and the frequency of the double wave is set to 26 GHz. In FIG. 3, a frequency trace 302 of the impedance that is observed in a view toward the right side of the middle nodes B and C of FIG. 2 and a frequency trace 301 of the impedance that is observed in a view toward the left side of the middle nodes B and C of FIG. 2 are plotted in the Smith chart. In this case, the frequency trace 301 of the impedance is an impedance including the resonance circuit 250, and, the frequency trace 302 of the impedance is an impedance including the DC cut capacitors 7, 7, but not an impedance including the resonance circuit 250.

In FIG. 3, the frequency trace 301 of the impedance takes a low value at a frequency of the fundamental wave, which is at a point D of 13 GHz, representing the effectiveness of the resonance circuit 250. In this case, the dislocation of the point D away from the "short" position (i.e., the left-most point in the Smith chart) is caused by the nominal loss of the resonance circuit 250.

On the other hand, the frequency trace 301 of the impedance substantially takes a complex conjugate impedance value at a double wave frequency, which is at a point E of 26 GHz, relative to the frequency trace 302 of the impedance, at a point F. Therefore, at the node 230, 231, the complex conjugate impedance matching is realized.

In other words, the resonance circuit 250 is resonated by the fundamental wave (i.e., at a low impedance), and serves as an impedance matching device at the frequency of the double wave.

When the impedance is being matched as shown in FIG. 3, the waveform at the nodes 230, 231 of the frequency multiplier becomes closer to be symmetric and closer to a sine waveform, and, when the impedance is not being matched, the waveform of the output signal from the frequency multiplier becomes asymmetric and does not have a sine waveform.

Figure 4A:
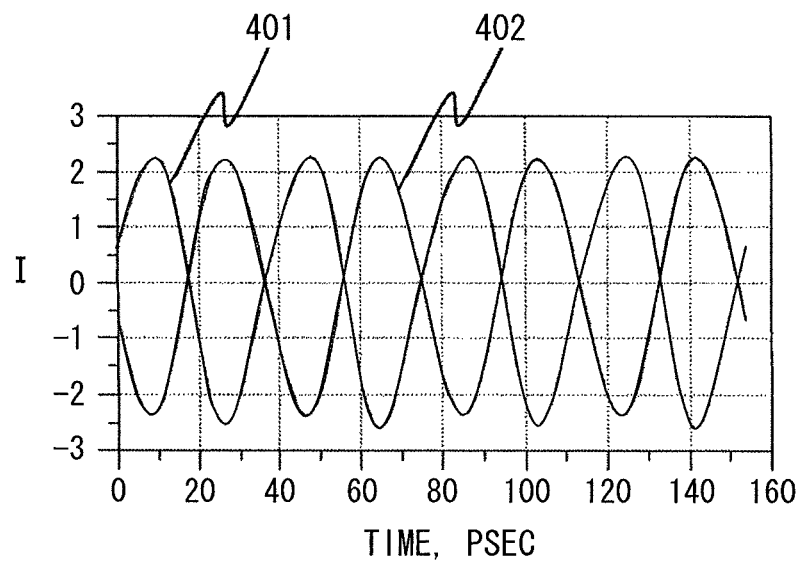
FIG. 4A is a waveform diagram of an output current of the frequency multiplier of FIG. 2 when a most suitable resonance circuit is used
Figure 4B:
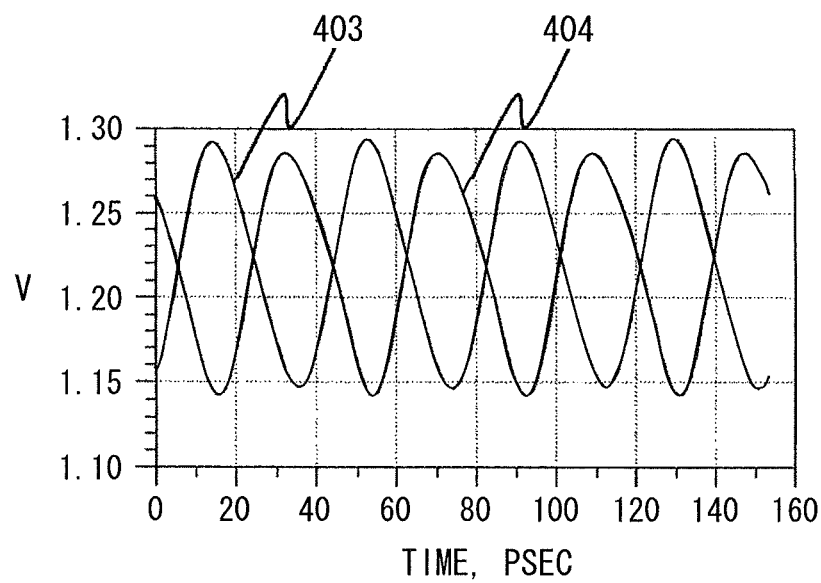
FIG. 4B is a waveform diagram an output voltage of the frequency multiplier of FIG. 2 when a most suitable resonance circuit used.

FIGS. 4A and 4B are waveform diagrams of an output current and an output voltage of the frequency multiplier in FIG. 2, respectively, when a most suitable resonance circuit 250 is coupled thereto. That is, FIGS. 4A and 4B shows the calculation result of the waveforms of the electric current and the voltage generated at the nodes 230, 231. In FIG. 4A, two waveforms 401, 402 are two waveforms of the electric current (unit: Ampere), which are symmetric with each other and in a sine waveform. In FIG. 4B, two waveforms 403, 404 are the waveform of the voltage (unit Volt), which are also symmetric with each other and in a sine waveform, just like the waveforms of the electric current. Where waveform 401 and 403 corresponds to the output of the node 230 and waveform 402 and 404 corresponds to the output of node 231.

Figure 5A:
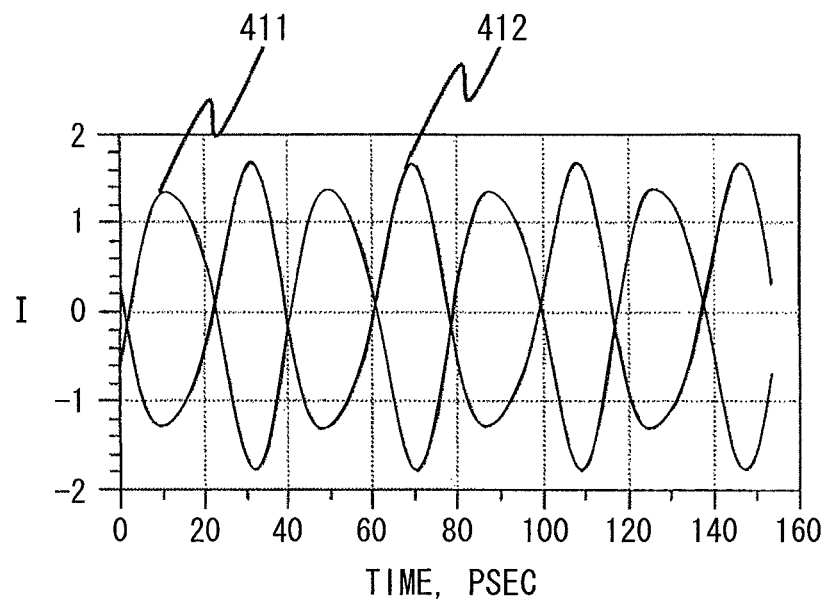
FIG. 5A is a waveform diagram of an output current of the frequency multiplier of FIG. 2 when a non-suitable resonance circuit is used.
Figure 5B:
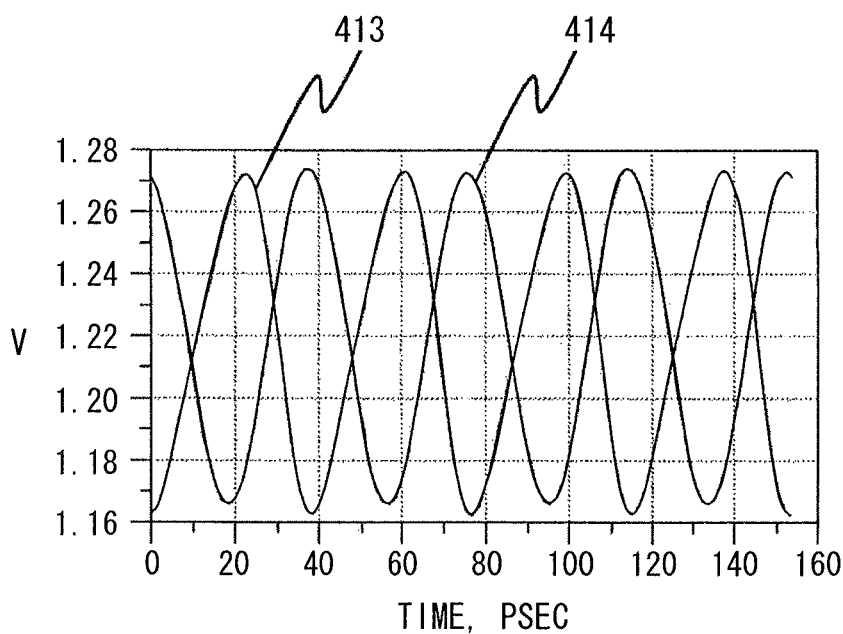
FIG. 5B is waveform diagram an output voltage of the frequency multiplier in FIG. 2 when a non-suitable resonance circuit is used.

FIGS. 5A and 5B are waveform diagrams of an output current an output voltage of the frequency multiplier in FIG. 2 when a non-suitable resonance circuit 250 is connected thereto. That is, the plots in FIGS. 5A and 5B show the waveform calculation results when the resonance circuit 250 does not serve as an impedance matching circuit. In FIG. 5A, waveforms 411, 412 are the waveform of the electric current, and, in FIG. 5B, waveforms 413, 414 are the waveform of the voltage. Where waveform 411 and 413 corresponds to the output of node 230 and 412 and 414 corresponds to the output of node 231. Here, the inductance of the inductor 240 is 1.0 nH, and the capacitance of the capacitor 241 is 0.15 pF. According to the Equation 1, the resonance frequency of the resonance circuit 250 is calculated as 13 GHz. However, the impedance matching is not enabled.

Figure 6:
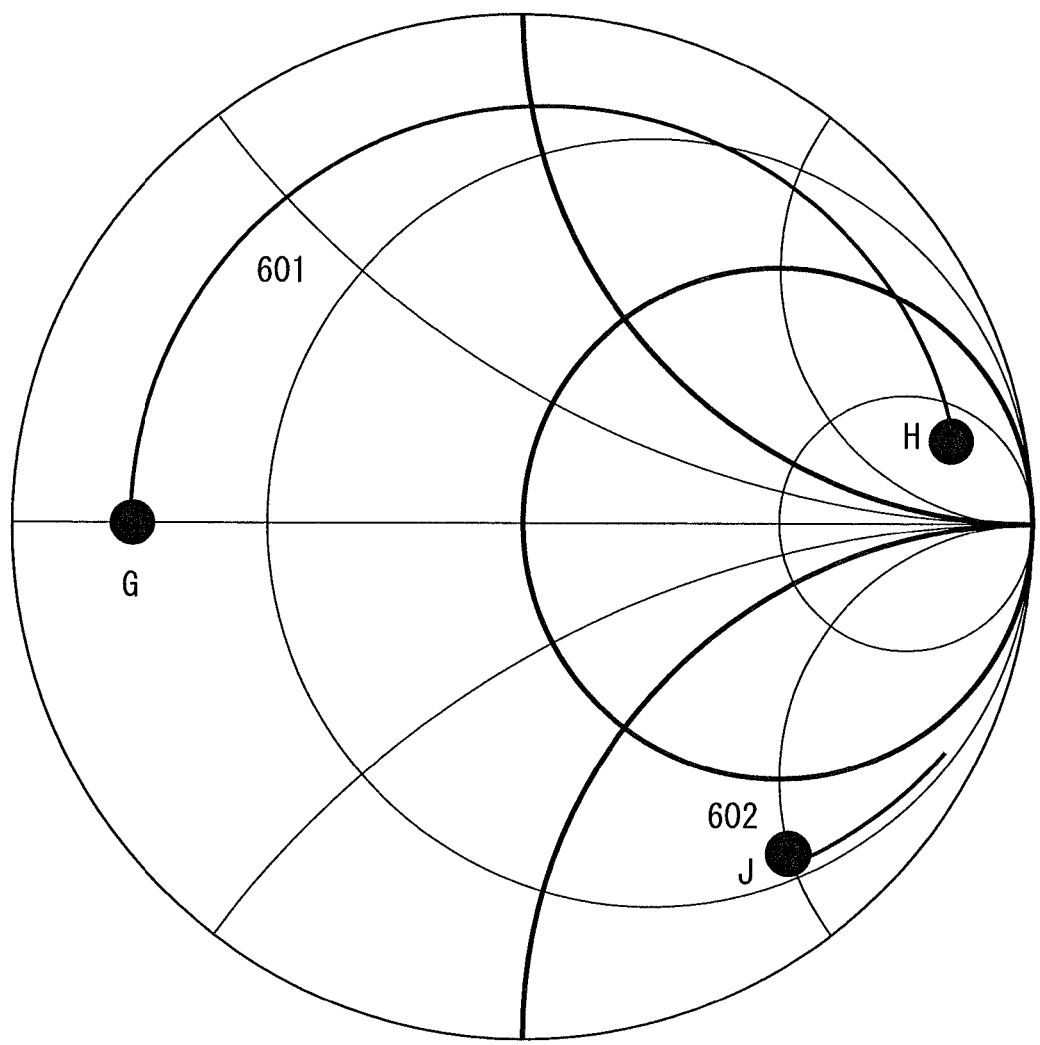
FIG. 6 is a frequency trace chart of impedance of a resonance circuit based on non-suitable design values.
Figure 7:
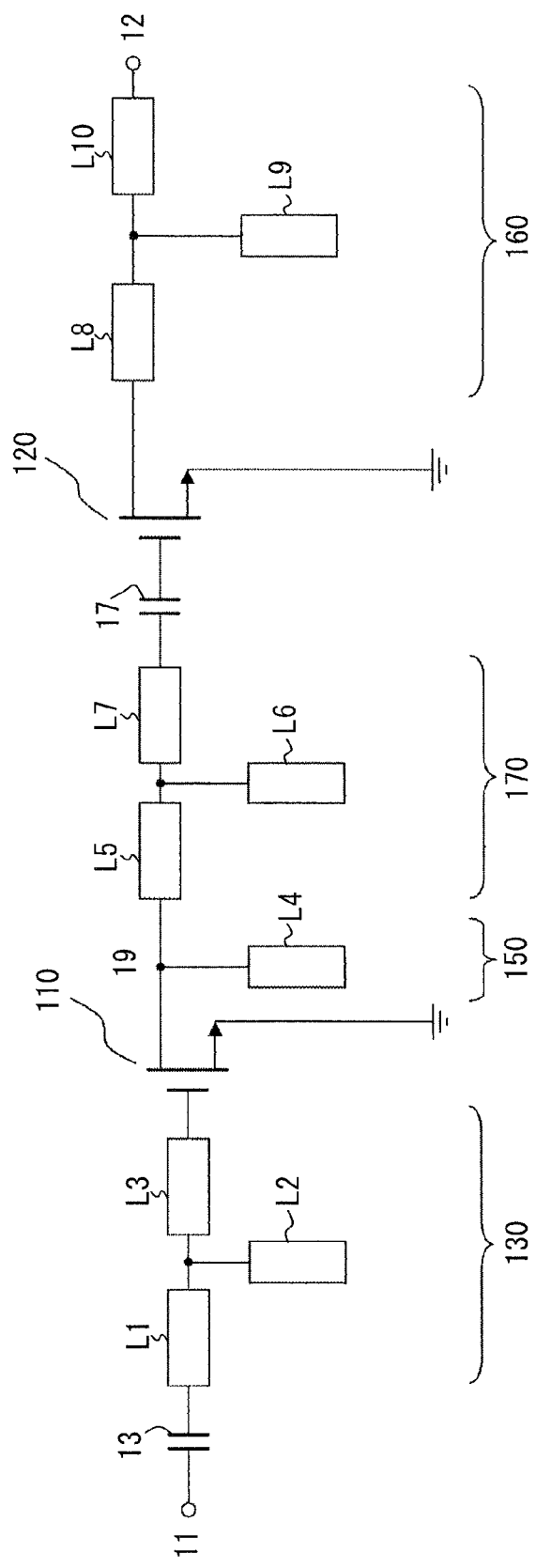
FIG. 7 is a circuit configuration diagram of a conventional frequency multiplier using FET.
Figure 8:
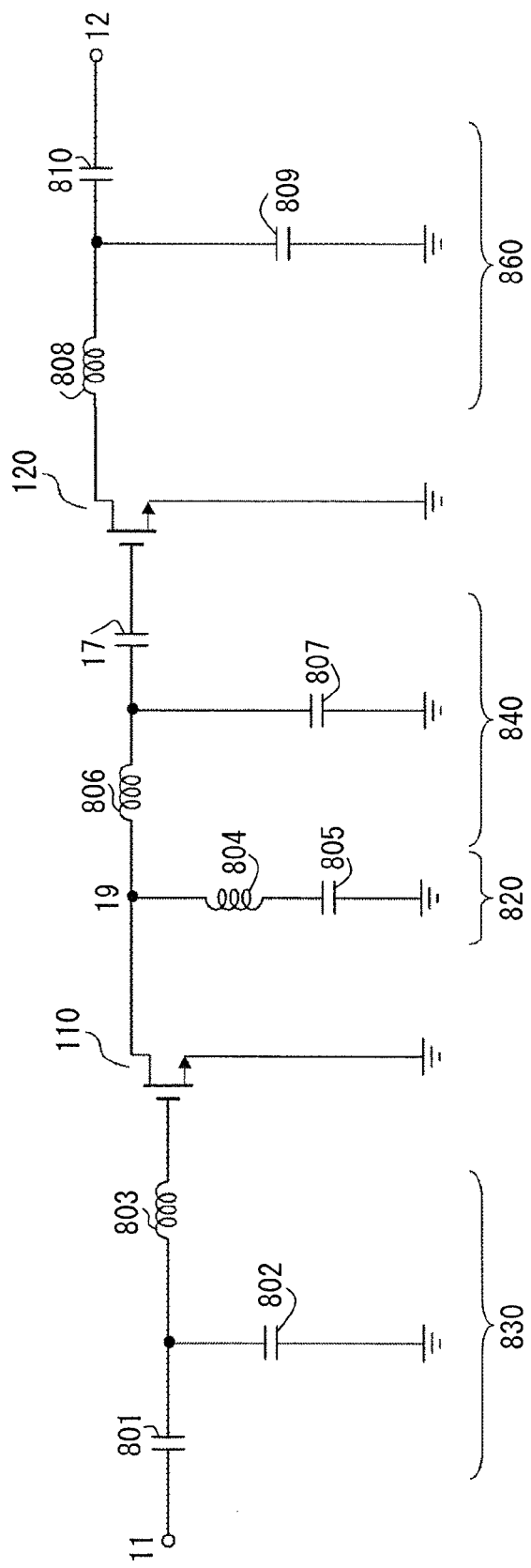
FIG. 8 is a circuit configuration diagram of a conventional frequency multiplier using an inductor and a capacitor.

In FIG. 6, similarly to FIG. 3, a frequency trace 601 of the impedance that is observed in a view toward the left side of the middle nodes B and C and a frequency trace 602 of the impedance that is observed in a view toward the right side of the middle nodes B and C are shown based on a condition that the inductance of the inductor 240 is 1.0 nH and the capacitance of the capacitor 241 is 0.15 pF. As clearly shown in FIG. 6, the impedance value is low at the base frequency, at a point G. However, a comparison between the impedances of the double wave frequencies reveals that a point H and a point J, where point J corresponds to point F in FIG. 3, are greatly dislocated from the complex conjugate matching position. That is, the complex conjugate impedance matching is not achieved at the middle nodes B and C. Therefore, as shown in FIGS. 5A and 5B, the waveforms of the electric current (unit: Ampere) and the voltage (unit: Volt) between the nodes 230, 231 do not become symmetrical or do not take a sine waveform.

Further, when FIGS. 5A and 5B are compared with FIGS. 4A and 4B, both of the electric current amplitude and the voltage amplitude are greater in FIGS. 4A and 4B, which indicates that the output power of the frequency multiplier is greater in FIGS. 4A and 4B. Therefore, it is effective for the increase of the output power to perform an impedance matching by using the resonance circuit 250.

Although the transistors in FIG. 2 are depicted as bipolar transistors, those skilled in the art will appreciate in view of this disclosure that the bipolar transistors may be replaced with a FETs for performing the same operation as the bipolar transistors.

Further, though the above explanation has a focus on an acquisition/extraction of the double wave, an acquisition of the other harmonic waves such as a four-fold wave (i.e., a quadruple wave), a six-fold wave (i.e., a sextuple wave) and the like is performed in the same manner. That is, the frequency multiplier for those waves can be designed in the same manner by setting the frequency points E, F in FIG. 3 to the frequency points of the desired harmonic wave.

In accordance with the foregoing, a half-wave generation circuit and a multiplication circuit are used as "an input circuit." Further, an amplifier, an antenna and the like are used as "an output circuit."

In addition, the frequency multiplier of the present disclosure is characterized in that the above input circuit is a half-wave generation circuit that generates a middle signal having (a) a frequency component that has a same frequency as the input signal and (b) frequency components of n-time multiplies by performing a half-wave rectification on the input signal that is input from the input node.

In addition, the half-wave generation circuit includes a transistor that may be a FET or a bipolar transistor. When the transistor is a FET, the source electrode is grounded and the drain electrode is coupled to the middle node. When the transistor is a bipolar transistor the emitter electrode is grounded and the collector electrode is coupled to the middle node. Additionally, a power supply circuit supplies a bias voltage for operating the transistor in a saturation region.

In addition, the half-wave generation circuit includes a differential amplifier that includes two transistors and a power supply circuit that supplies a bias voltage for operating the transistor in a saturation region. Where when the transistors are FETs the drain electrode is coupled to the middle node, and when the transistors are bipolar transistors the collector electrode is coupled to the middle node.

Accordingly, it is effective and advantageous, for the size reduction of the frequency multiplier to have the resonance circuits 6, 250 at the middle nodes (i.e., the node A in FIG. 1, or the nodes B, C in FIG. 2) for suppression of the fundamental wave, because such resonance circuits 6, 250 also serve as the impedance matching circuit for the double wave.

Further, as shown in the second embodiment that illustrates the frequency multiplier having the differential circuit, the resonance circuit 250 for suppression of the fundamental wave serves as an impedance matching device, thereby effectively improving the degree of symmetry of the transistor pairs 210A and 260A, and effectively bringing the waveforms of the electric current and the voltage closer to a sine waveform.

As described above, because the frequency multiplier of the present disclosure has a resonance frequency of the resonance circuit equated with a frequency of the input signal, and has the output impedance of the resonance circuit matched with the input impedance of the output circuit, the resonance circuit for suppressing the fundamental wave at the middle node also serves as the impedance matching circuit for the n-time multiple waves, thereby enabling a smaller size of the frequency multiplier.

Further, in case that a half-wave generation circuit in the frequency multiplier uses a differential amplifier as the input circuit, the resonance circuit for fundamental wave suppression performs the impedance matching, thereby improving the symmetrical characteristics of differential operation of the transistor pair. As a result, the waveforms of the voltage and the electric current are effectively made closer to a sine waveform.

Although the present disclosure has been fully described in connection with preferred embodiment thereof with reference to the accompanying drawings, it is to be noted that various changes and modifications will become apparent to those skilled in the art, and changes, modifications, and summarized schemes are to be understood as being within the scope of the present disclosure as defined by appended claims.

What is claimed is:

1. A frequency multiplier having (i) an input circuit that is disposed between an input node and a middle node for generating and outputting a middle signal having (a) signal components of an even number "n" multiple of frequencies of an input signal that is input to the input node and (b) a signal component of a same signal frequency as the input signal, and (ii) an output circuit that has a predetermined input impedance for a signal from the middle node to which the output circuit is coupled, the frequency multiplier comprising:
   a resonance circuit that is formed as a series connection of an inductor and a capacitor and that is coupled in parallel to the middle node, wherein
   the resonance circuit has a resonance frequency that is equal to a frequency of the input signal, and
   the resonance circuit has an output impedance that matches with the predetermined input impedance of the output circuit.

2. The frequency multiplier of claim 1, wherein
   the input circuit is a half-wave generation circuit that generates a middle signal having a frequency component that is equal to the frequency of the input signal and the even number "n" multiple of frequencies by performing a half-wave rectification on the input signal that is input from the input node.

3. The frequency multiplier of claim 2, wherein the half-wave generation circuit includes:
   a transistor that has a first terminal coupled to a ground, a second terminal coupled to the middle node, and
   a power supply circuit that supplies a bias voltage to the transistor for operating the transistor in a saturation region.

4. The frequency multiplier of claim 2, wherein the half-wave generation circuit includes:
   a differential amplifier that includes at least two transistors, a first terminal of both of the transistors are coupled to the middle node,
   a power supply circuit that supplies a bias voltage for operating the transistor in a saturation region.

5. The frequency multiplier of claim 3, wherein:
   the transistor is either a field effect transistor (FET) or a bipolar transistor, and
   when the transistor is a FET, the first terminal is a source of the FET and the second terminal is a drain of the FET, and
   when the transistor is a bipolar transistor, the first terminal is an emitter terminal of the bipolar transistor and the second terminal is a collector terminal of the bipolar transistor.

6. The frequency multiplier of claim 4, wherein:
   the transistors are either a field effect transistor (FET) or a bipolar transistor, and
   when the transistors are a FET, the first terminal is a drain of the FET, and when the transistor is a bipolar transistor, the first terminal is a collector terminal of the bipolar transistor.

* * * * *